United States Patent
Niemann et al.

(10) Patent No.: US 7,414,414 B2
(45) Date of Patent: Aug. 19, 2008

(54) SPATIALLY DISTRIBUTED GUARDED IMPEDANCE

(75) Inventors: James A. Niemann, Aurora, OH (US); John Gibbons, Macedonia, OH (US); Kevin Cawley, Sagamore Hills, OH (US); Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 11/489,356

(22) Filed: Jul. 19, 2006

(65) Prior Publication Data

US 2008/0018348 A1    Jan. 24, 2008

(51) Int. Cl.
    *G01R 27/26*    (2006.01)
    *G01F 23/00*    (2006.01)

(52) U.S. Cl. .................. 324/688; 324/627; 324/705; 73/304 C

(58) Field of Classification Search .............. 324/627, 324/688, 705, 713; 73/304 C
See application file for complete search history.

(56) References Cited

U.S. PATENT DOCUMENTS

| | | | | |
|---|---|---|---|---|
| 4,332,167 | A * | 6/1982 | Sun et al. | 73/304 C |
| 5,153,502 | A * | 10/1992 | Morgan et al. | 324/123 R |
| 6,278,281 | B1 * | 8/2001 | Bauer et al. | 324/441 |
| 2002/0171433 | A1 * | 11/2002 | Watanabe et al. | 324/539 |
| 2003/0136189 | A1 * | 7/2003 | Lauman et al. | 73/304 C |

* cited by examiner

*Primary Examiner*—Vincent Q Nguyen
(74) *Attorney, Agent, or Firm*—Pearne & Gordon LLP

(57) ABSTRACT

A guarded sense impedance for use in a measurement instrument includes a sense impedance adapted to have a spatially distributed electrical potential and at least one guard structure adapted to have the spatially distributed electrical potential. The guard structure is arranged to provide a spatially distributed guard potential for the sense impedance.

16 Claims, 4 Drawing Sheets

SPATIALLY DISTRIBUTED GUARDED IMPEDANCE

BACKGROUND OF THE INVENTION

The present invention relates to precision electrical measurements and, in particular, to guarded measurement circuits.

In precision electrical measurements, it is known to minimize effects such as leakage or other contributions of noise in the measurement circuitry using guarding. An important measurement node is "guarded" by driving nodes in the area surrounding the important node to the same potential as the node itself. With no potential difference between its surroundings, there is nothing to degrade the measurement. This is basically a DC technique, where it is often necessary to allow transients to subside between measurements.

Increasingly, there is a need to not only make faster measurements, but also, to make more precision measurements of pulsed and RF circuits.

SUMMARY OF THE INVENTION

A guarded sense impedance for use in a measurement instrument includes a sense impedance adapted to have a spatially distributed electrical potential and at least one guard structure adapted to have the spatially distributed electrical potential. The guard structure is arranged to provide a spatially distributed guard potential for the sense impedance. The guard structure is at least one of a serpentine resistance on a planar substrate, a substantially planar resistance on a planar substrate, an interdigitating electrode pair, or an array of at least three guard electrodes juxtaposed along the sense impedance.

DESCRIPTION OF THE PREFERRED EMBODIMENTS

Figure 1:
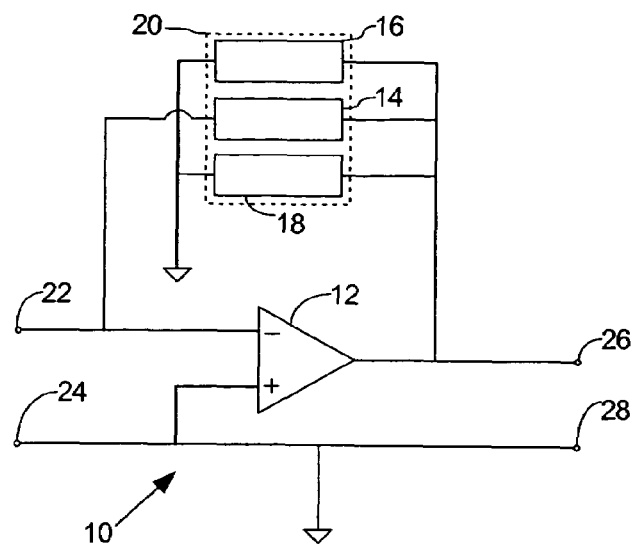
FIG. 1 is a schematic circuit diagram of an example of a measurement system according to the invention.

Referring to FIG. 1, a measurement instrument 10 includes a operational amplifier 12, a sense impedance 14 and guard structures 16, 18, the combination of the impedance 14 and the structures 16, 18 acting as a guarded sense impedance 20.

The instrument 10 is chosen for simplicity to aid in the understanding the operation of the guarded sense impedance 20. Ignoring for the moment the guard structures 16, 18, the amplifier 12 and the sense impedance 14 connected as shown provide a current to voltage converter. A current applied to the terminals 22, 24 result in a voltage at the terminals 26, 28. For example, a device under test may provide current at the terminals 22, 24 and a suitable unshown circuit would provide a measurement of the voltage at terminals 26, 28 that would directly correspond to the current from the device under test.

As the impedance of the sense impedance 14 increases, the circuit is able to measure ever smaller currents. However, it also becomes more sensitive to any leakage or other apparent changes in the feedback loop through the sense impedance 14.

In the case of large sense impedances (physically or electrically) and/or non-DC signals (e.g., transients, pulses, AC, RF), it becomes desirable to treat the sense impedance 14 as not just an ideal impedance between two nodes, but as an impedance having a spatially distributed potential. For example, a resistor with a voltage across it has a voltage gradient from one end to the other.

It is in this regime that the guard structures 16, 18 become very advantageous. Rather than just applying a guard voltage around the area of a node of the sense impedance 14, the guard voltage is applied across the guard structures. For example, the guard structures 16, 18 may be impedances such as resistors. As a result, the guard structures 16, 18 also have a spatially distributed potential. If the guard structures 16, 18 are arranged on opposite sides of the sense impedance 14, the impedance 14 and the guard structures 16, 18 all have matching voltage gradients. The guard potential the sense impedance 14 "sees" is a spatially distributed potential that matches its own in each direction, and that is essentially all it sees. The sense impedance will see a spatially distributed field or potential that matches its own. This can be the case not only for DC measurements, but also, for non-DC measurements as the potentials can all rise and fall together. When the spatially distributed potentials are the same, the sense impedance 14 is isolated from leakage currents and shielded from the effects of stray impedance to any other potential that is not following the spatially distributed field.

The bandwidth of the measurement should fall within the region of the circuit's lowest noise for the guarded sense impedance, namely the Johnson noise of the sense impedance rather than the guard structure. The low frequency noise will be that of the sense impedance and the high frequency noise (out of band noise) will be that of the guard impedances. The impedance of an impedance guard structure should be less than that of the sense impedance allowing the guarded sense impedance to have more bandwidth or faster step response than an unguarded sense impedance. This technique will work best when a high frequency "out of band" region can be defined, where a higher noise floor is acceptable.

It should be noted that in some cases just one guard structure arranged to mirror the sense impedance may provide adequate performance or, in other cases, more than two guard structures about the sense impedance may be desirable.

The guard structures may be, for example, impedances having complex values or just resistors, depending on the needs of the instrument.

In general, the guards should have a distributed electric field that matches that of the sense impedance. For example, besides using distributed guard impedances, it is also possible to use guards that simply have the desired field pattern. Such patterns may be produced, for example, by more directly spatial methods. The guards may be arranged in spacing and/or in shape to provide the desired field structure. In addition, it is possible to directly apply desired potentials to elements of a guard to achieve the field pattern.

Figure 2:
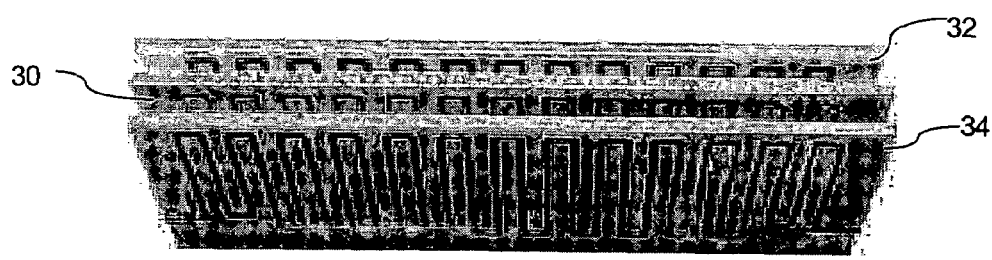
FIG. 2 is a perspective view of resistors arranged according to an example of the invention.

Referring to FIG. 2, precision high resistance resistors may be physically large, because they are formed from serpentine resistive traces on planar substrates. For example, low current measurements may require, for example, 100 megohms to 4 teraohms resistance. For example, the planar resistors 30, 32, 34 having serpentine resistive traces may correspond to the sense impedance 14 and the guard structures 16, 18, respectively.

Figure 3:
FIG. 3 is a perspective view of resistors arranged according to another example of the invention.

Referring to FIG. 3, the planar resistors 36, 38 having a planar resistive surface (e.g., a resistive film) may also correspond to the guard structures 16, 18. The resistor 40 may include an unshown narrow longitudinal resistive trace corresponding to the sense impedance 14.

Figure 4:
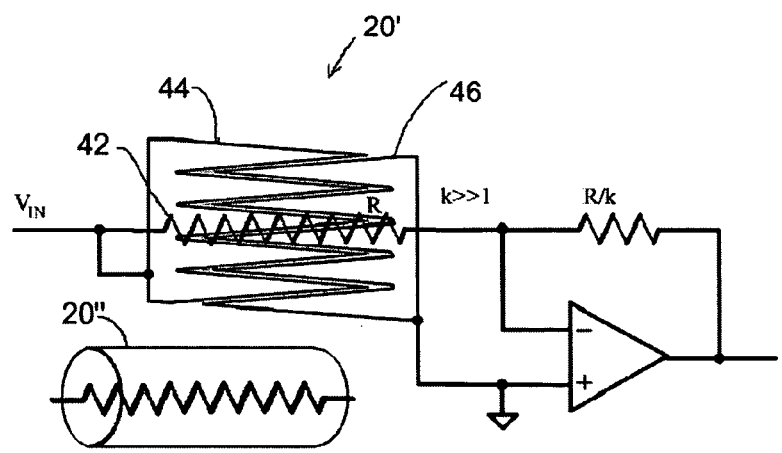
FIG. 4 is a schematic circuit diagram of a further example according to the invention.

Referring to FIG. 4, another example of a guarded sense impedance 20' includes the sense impedance 42 and a pair of interdigitating electrodes 44, 46. The "fingers" of the electrodes 44, 46 are electrically distinct. The electrode 44 is connected to one end of the impedance 42 and the electrode 46 is connected to a guard potential corresponding to the potential of the other end of the impedance 42. The resulting net electric field seen by the impedance 42 as one set of fingers tapers down and the other set tapers up has a spatial distribution corresponding to that of the impedance 42.

In some cases, it may be adequate for the electrodes 44, 46 to form one or more planar structures next to the impedance 42. In other more stringent cases, the electrodes 44, 46 may be wrapped around the impedance 42 to form the guarded sense impedance 20''. The electrodes 44, 46 may be, for example, formed from conductive sheets, cylinders, films, or other suitable conductive surfaces.

Figure 5:
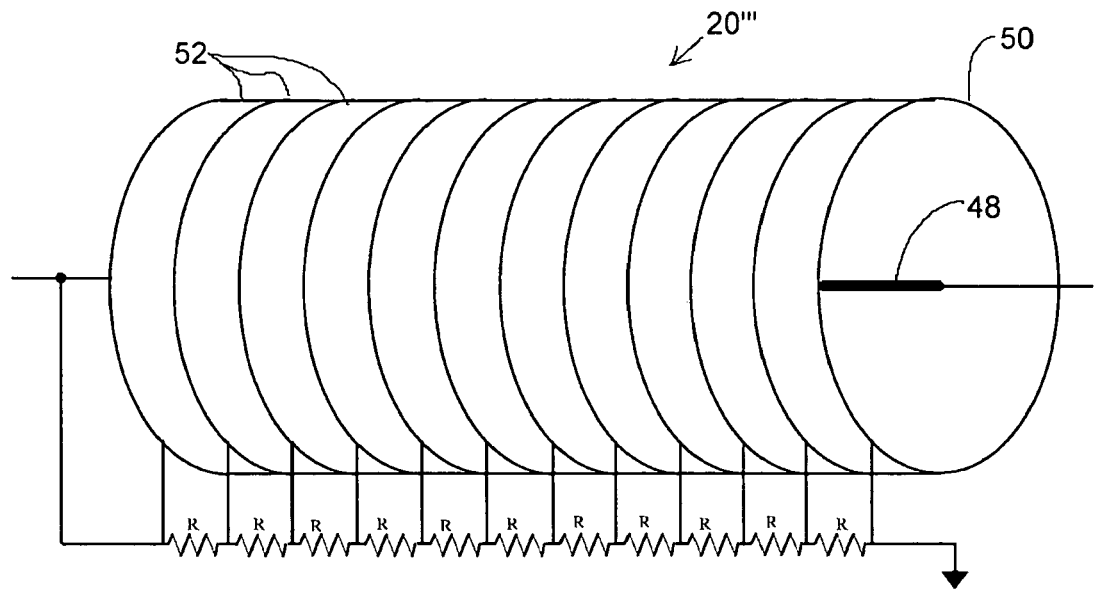
FIG. 5 is a schematic circuit diagram of another further example according to the invention

Referring to FIG. 5, another example of a guarded sense impedance 20''' includes the sense impedance 48 surrounded by an array 50 of guard electrodes 52. Each guard electrode 52 has the desired guard potential at that spatial point directly applied. In this example, the various potentials are tapped off a resistive voltage divider, but the potentials could also be more directly and/or individually created.

Figure 6:
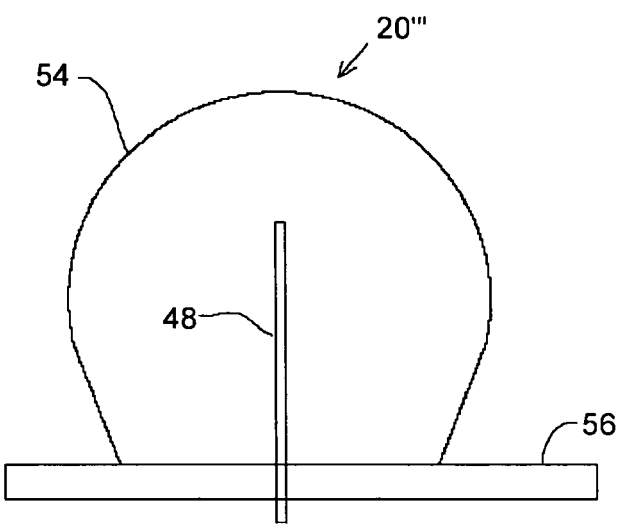
FIG. 6 is a side elevation view of still another example according to the invention.
Figure 7:
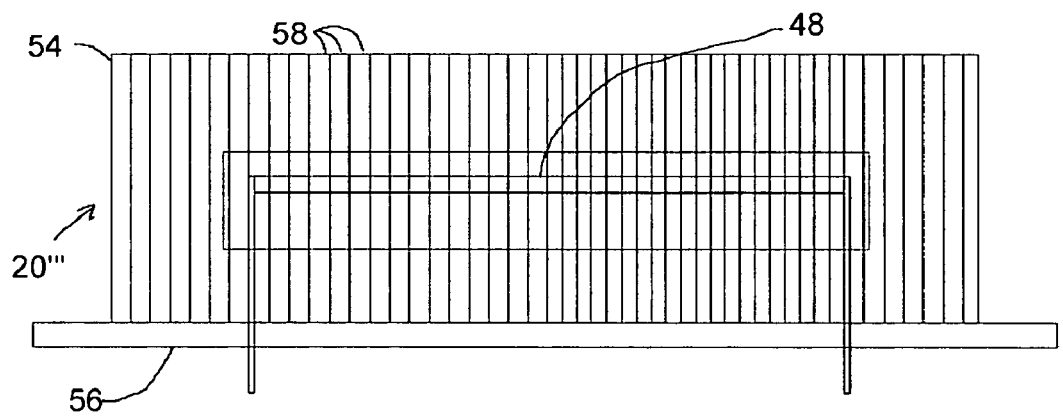
FIG. 7 is front elevation view of the example of FIG. 6.
Figure 8:
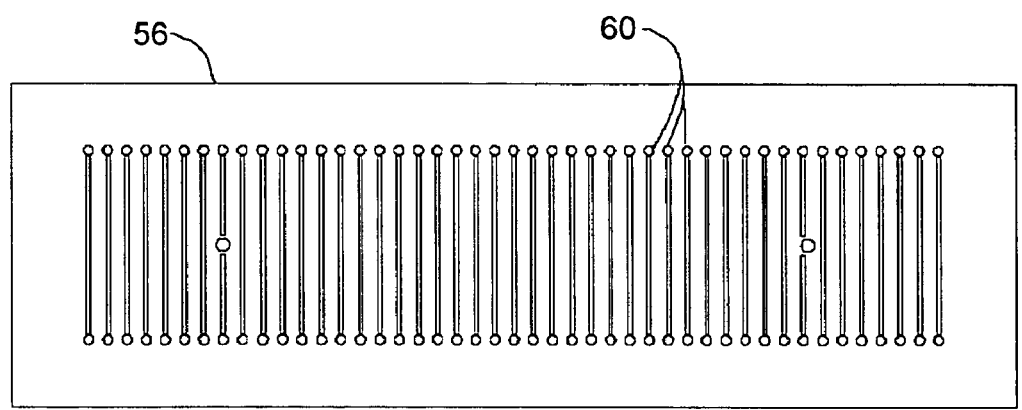
FIG. 8 is a bottom plan view of the example of FIG. 7.

Referring to FIGS. 6, 7 and 8, a more specific example of the guarded sense impedance 20''' can be formed from a section of ribbon cable 54 curved around the sense impedance 48, all mounted on a printed circuit board 56. Each wire 58 of the cable, in combination with respective circuit board traces 60, forms one of the guard electrodes.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A guarded sense impedance for use in a measurement instrument, comprising:
   a sense impedance adapted to generate a spatially distributed electrical potential; and
   at least one guard structure adapted to have said spatially distributed electrical potential, wherein said guard structure is arranged to provide a spatially distributed guard potential for said sense impedance and said guard structure is at least one of a serpentine resistance on a planar substrate, a substantially planar resistance on a planar substrate, an interdigitating electrode pair, or an array of at least three guard electrodes juxtaposed along said sense impedance.

2. A guarded sense impedance according to claim 1, further comprising another guard structure adapted to generate said spatially distributed electrical potential wherein said guard structures are arranged on opposite sides of said sense impedance.

3. A guarded sense impedance according to claim 1, wherein said sense impedance is a resistor.

4. A guarded sense impedance according to claim 3, wherein the resistance of the sense impedance is in the range of 100 megohms to 4 teraohms.

5. A guarded sense impedance according to claim 1, wherein said guard structure and said sense impedance are each in the form of serpentine resistive traces on a planar substrate.

6. A guarded sense impedance according to claim 1, wherein said interdigitating electrode pair surrounds said sense impedance.

7. A guarded sense impedance according to claim 1, wherein said array of at least three guard electrodes comprises the conductors of a portion of ribbon cable about said sense impedance.

8. A guarded sense impedance according to claim 7, wherein said array of at least three guard electrodes further comprises respective circuit board traces connected to said ribbon cable conductors.

9. A method for guarding a sense impedance in a measurement device, wherein said sense impedance has a spatially distributed electrical potential, said method comprising:
   providing at least one guard structure having said spatially distributed electrical potential, said guard structure being at least one of a serpentine resistance on a planar substrate, a substantially planar resistance on a planar substrate, an interdigitating electrode pair, or an array of at least three guard electrodes juxtaposed along said sense impedance; and
   arranging said at least one guard structure to provide a spatially distributed guard potential for said sense impedance.

10. A method according to claim 9, further comprising:
    providing another guard structure having said spatially distributed electrical potential; and
    arranging said another guard structure with respect to said sense impedance wherein said guard structures are arranged on opposite sides of said sense impedance.

11. A method according to claim 9, wherein said sense impedance is a resistor.

12. A method according to claim 11, wherein the resistance of the sense impedance is in the range of 100 megohms to 4 teraohms.

13. A method according to claim 9, wherein said guard structure and said sense impedance are each in the form of serpentine resistive traces on a planar substrate.

14. A method according to claim 9, wherein said interdigitating electrode pair surrounds said sense impedance.

15. A method according to claim 9, wherein said array of at least three guard electrodes comprises the conductors of a portion of ribbon cable about said sense impedance.

16. A method according to claim 15, wherein said array of at least three guard electrodes further comprises respective circuit board traces connected to said ribbon cable conductors.

* * * * *